United States Patent [19]
O'Connor et al.

[11] Patent Number: 4,926,118
[45] Date of Patent: May 15, 1990

[54] TEST STATION

[75] Inventors: R. Bruce O'Connor, San Diego; Thomas E. Toth, El Cajon; James A. Ross, Poway, all of Calif.

[73] Assignee: Sym-Tek Systems, Inc., San Diego, Calif.

[21] Appl. No.: 158,941

[22] Filed: Feb. 22, 1988

[51] Int. Cl.$^5$ .................... G01R 31/28; B07C 5/344
[52] U.S. Cl. ........................... 324/158 F; 324/158 R; 73/865.6; 209/573
[58] Field of Search .......... 324/158 F, 73 PC, 158 P, 324/73 AT, 73 R; 209/513, 552, 657; 73/865.6

[56] References Cited

U.S. PATENT DOCUMENTS

| | | | |
|---|---|---|---|
| 3,094,212 | 6/1963 | Moore et al. | 324/73 AT |
| 3,209,907 | 10/1965 | Wiesler et al. | 209/573 X |
| 3,408,565 | 10/1968 | Frick et al. | 324/158 F |
| 3,664,499 | 5/1972 | Sahakian | 209/573 X |
| 3,996,517 | 12/1976 | Fergason et al. | 324/158 F |
| 4,694,964 | 9/1987 | Ueberreiter | 324/73 AT X |
| 4,695,707 | 9/1987 | Young | 324/158 F X |
| 4,755,746 | 7/1988 | Mallory et al. | 324/158 F X |

OTHER PUBLICATIONS

Schorr et al., "Chip Handler Apparatus for Testing Semiconductor Devices", IBM Technical Disclosure Bulletin, vol. 20, No. 3, Aug. 1977, pp. 1100–1101.

Primary Examiner—Reinhard J. Eisenzopf
Assistant Examiner—Vinh P. Nguyen
Attorney, Agent, or Firm—Thomas J. Tighe

[57] ABSTRACT

A station for testing electrical devices under elevated and depressed temperature conditions, said devices being transported through and tested in the station while held in coordinated planar sets. The planarly arranged sets of devices are sequentially placed upon a platen movable along three mutually orthogonal axes. A test head has a plurality of electrical device contactors in planar arrangement corresponding to the arrangement of the devices sets. At least one axis along which the platen moves is orthogonal to a general plane of the contactors for establishing parallel contact between the devices and the contactors. During testing each of the leads of the devices resting upon the platen are electrically contacted by a contactor. The leads of the full set of electrical devices can be contacted simultaneously, or the leads can be contacted in subsets depending upon the capacity of the test head. The test head energizes and stimulates the electrical devices, and the responses of the devices are communicated to a tester via the test head. Prior to being deposited upon the platen, the planarly arranged sets of electrical devices are conveyed through a chamber which elevates or depresses the temperature of the devices to a selected testing temperature. Following testing, the sets of electrical devices are conveyed through a chamber which brings the temperature of the devices back to or near equilibrium with the temperature ambient to the test center.

6 Claims, 9 Drawing Sheets

TEST STATION

BACKGROUND OF THE INVENTION

This invention relates in general to machines for simultaneously testing pluralities of electrical and electronic devices over the operating temperature ranges of said devices, and in particular to such machines further adapted to perform the testing on planarly arranged pluralities of said devices, such as devices mounted in the electrical device transport media presented in a U.S. patent application filed on June 27, 1986, Ser. No. 06/879,307, now copending.

As used herein, the term "electrical device" shall refer to singularly packaged electrical and electronic components such as semiconductor devices, integrated circuit devices, hybrid devices and the like. As used herein, the term "backend processing" shall refer to and mean all of the heating, cooling, testing, sorting, marking and other processes which an electrical device undergoes from the time it is assembled to the time it is ready for shipment to a customer. This invention performs the backend processing operations of heating, cooling and testing of electrical devices.

Generally, assembled electrical devices are transported through the various backend processing machines in one of two ways. One is known as "naked" handling, where no type of electrical device protection or handling standardization is used. The devices are fed "as is" to a processing machine from a transport medium known as a tube. One tube generally holds 15 to 30 devices depending on the device size. The devices are stacked in the tubes. A typical tube contains twenty-seven 16-pin, 300 mil devices. Generally, the tubes are made of plastic or aluminum. They do not carry any kind of readable tracking identification indicia and are hand-carried, typically in a box or tote, from process step to process step. The devices must be removed from the tubes for each process step on a per machine basis. When a machine has completed a process step (or steps), the devices are returned back into a tube (probably a different tube) to be carried to the next process step. Information containing the results of the last and all previous process steps is usually recorded by hand on a piece of paper (traveler) and is transported with each group (lot) of tubes.

Such conventional processing technology, therefore, is very labor intensive. In large manufacturing facilities workers are needed to transport the tubes of devices from process step to process step. In fact, manufacturing lot sizes are typically limited to the number of devices that one operator can carry by hand. Many times, the integrity of the results of a process step is dependent on where the operator places a tube of processed devices. Misplacing a tube can easily compromise the integrity of a lot. In addition, information associated with the lot is usually carried on paper with the devices and must be hand entered at each process step by the operator. This requires additional skilled operators and further allows for human error to be introduced.

Other problems with conventional backend processing are associated with loading and unloading the devices in tubes for each process step. Naked handling allows mechanical defects (bent leads, chips, etc.) and electrostatic discharge failures. Bent leads, in turn, can cause the various process machines to jam up.

Prior art backend processing machines must unload the electrical devices from the tubes and subsequently reload them into the tubes. Therefore, each machine must be adapted to a particular device form. Besides the expense of having such device specific machines, such adapted machines are quite prone to failure, (e.g. jams, mis-processing) due to minor fluctuations in device form and wear associated with high volumn handling. Furthermore, the electrical devices manufacturer is burdened by having to maintain various pieces of equipment that are dedicated to a particular device package form.

The other method of transporting electrical devices incorporates the use of a "carrier". The devices are placed in a plastic frame to protect the contact leads and to provide limited handling standardization. Carriers reduce mechanical defects and reduce package specific handling to some extent. But, carriers still cause jams due to wearing of the relatively soft plastic from which the carriers are made. Furthermore, handling standardization only occurs across common package styles with similar lead counts (i.e., 14–18 lead DIP's or 68–88 lead PGA's). Moreover, these carriers, with the devices installed, are also fed to the prior art machines in tubes and must be returned to the tubes at each stage.

This invention is a backend processor which does not require that the devices be individually unloaded from and subsequently reloaded into tubes. It also does not require that the limited plastic carriers be individually unloaded from and subsequently reloaded into tubes. It receives and processes electrical devices planarly arranged in a transport medium such as described in a U.S. patent application filed on June 27, 1986, Ser. No. 07/879,307. In such transport media, the electrical devices, up to 256 of them, are latched into seats defined by a planar tray, the seats being coordinately arranged, such as in a standard X-Y format, the tray being the common transport medium for the devices to and from all backend processing equipment, and during all processing. The seats of a tray can be configured to accommodate a wide variety of device package forms, while not changing the outside dimensions of the tray. Therefore the machine of this invention is not dependent on changing package types.

By using the machine of this invention, the devices can be loaded into a tray one time, processed by said machine while still in the tray, and then the tray can be used as the transport medium throughout the rest of the backend processing. This eliminates the need to handle the devices individually at each process step and thereby standardizes the equipment and greatly improves their reliability. The possibility of damage to the devices is vastly reduced as they are never touched by human hands, and the number of machine insertions are reduced to a minimum because full trays of devices are inserted rather than individual devices. Also, since each device in a tray occupies a unique position in a coordinate system, each device can be uniquely identified at each process step. Thus, the traceability and reliability of device process information is vastly improved over conventional methods.

Other advantages and attributes of this invention will be discussed in, or will be readily discernible upon a reading of, the text hereinafter.

SUMMARY OF INVENTION

This invention presents an electrical device test station comprising a loader, a "soak" stage, a test stage, an "unsoak" or exit stage, and an unloader, all responsive to a control means. The loader inserts electrical devices in planar, coordinated sets into the soak stage through which each set is timely conveyed, and during the conveyance the electrical devices in the set soak, i.e., they are exposed to an environment in which the ambient temperature is selectively elevated above or lowered below the temperature external to the test station to a degree that, at the conclusion of said conveyance, said devices are at a desired testing temperature. At the conclusion of its soak, each set of electrical devices is transferred into the test stage, the environment of the test stage being suitable to maintain the devices at their desired testing temperature. While in the test stage, leads of all the devices are electrically contacted by a test head. The leads of the full set of devices are contacted simultaneously, or the leads of suitable subsets of the devices are contacted simultaneously in steps. Via the electrical contacts, the devices are energized, stimulated and monitored for test purposes by a tester (not shown) which interfaces with the test head. At the conclusion of its testing, each set of electrical devices is transferred from the test stage to the unsoak stage through which it is timely conveyed, and during the conveyance the electrical devices in the set unsoak, i.e., they are exposed to an environment in which heat is transferred from or to the devices to the extent that, at the conclusion of said conveyance, the temperatures of said devices are at equilibrium with the environment external to the test station. The sets are then removed from the unsoak stage by the unloader.

An object of this invention is to provide a means of testing electrical devices which are transported in media such as described in U.S. patent application filed on June 27, 1986, Ser. No. 07/879,307, currently pending.

An object of this invention is to provide a means of testing electrical devices which are transported in media such as described in U.S. patent application filed on June 27, 1986, Ser. No. 07/879,307, currently pending, including soak and unsoak stages.

An object of this invention is to provide a means for bringing the temperature of electrical devices arranged in a generally planar configuration to a desired level, testing them in said configuration and subsequently returning the devices to ambient temperature.

Other objects of this invention will readily discernible upon the reading of the text hereinafter.

BRIEF DESCRIPTION OF THE DRAWINGS

Various preferred embodiments of this invention will best be understood by referring to the following drawings while reading the detail description wherein.

DESCRIPTION OF PREFERRED EMBODIMENT

Figure 1:
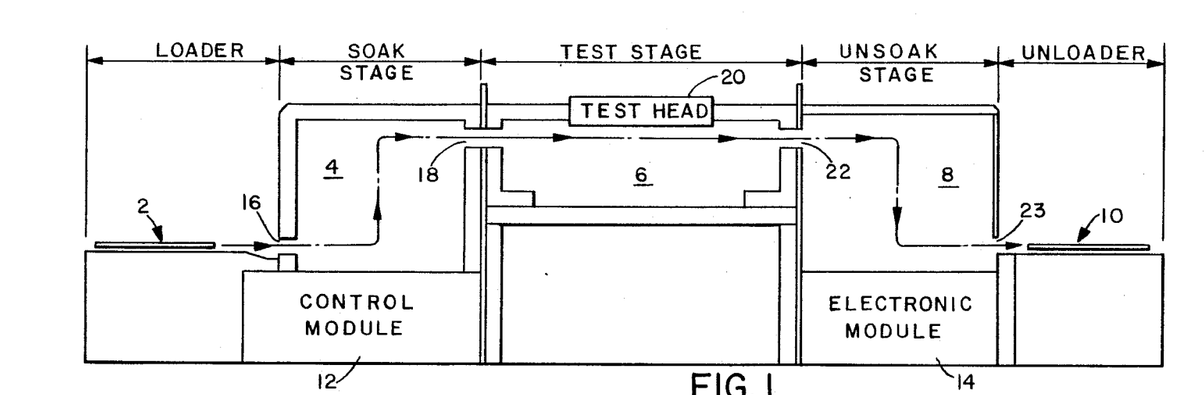
FIG. 1 is a schematic of the complete machine showing the various stages and the flow path of the test trays.

Referring to FIG. 1, an electrical device test station is illustrated having a loader 2, a "soak" stage 4, a test stage 6, an "unsoak" or exit stage 8, an unloader 10, a control module 12, and an electronic module 14. The loader 2, under direction of the control module 12, loads pluralities of electrical devices in coordinated sets through a first gate 16 into the soak stage 4. The sets are timely and orderly conveyed through the soak stage, and during the conveyance the electrical devices in each set soak, i.e., they are exposed to an environment in which the ambient temperature is selectively elevated above or lowered below the temperature external to the test station to a degree that, at the conclusion of said conveyance, said devices are at a desired testing temperature.

At the conclusion of its soak, each set of electrical devices is transferred through a passageway 18 into the test stage 6, the environment of the test stage being suitable to maintain the devices at their desired testing temperature. While in the test stage, the electrical leads of all the devices are electrically contacted by a test head 20. The leads of the full set of devices can be contacted simultaneously, or the leads of suitable subsets of the devices can be contacted simultaneously in steps depending on the capacity of the test head. Via the test head the devices are energized, stimulated and their responses monitored for test purposes by a tester (not shown) which communicates with the devices through the test head.

At the conclusion of its testing, each set of electrical devices is transferred from the test stage to the unsoak stage 8 through a second gate 22. Each of said sets is timely conveyed through the unsoak stage, and during the conveyance the electrical devices in the set unsoak, i.e., they are exposed to an environment in which heat is transferred from or to the devices to the extent that, at the conclusion of said conveyance, the temperatures of said devices are at or near equilibrium with the environment external to the test station. The sets are then removed from the unsoak stage through passageway 23 by the unloader 10.

Figure 2:
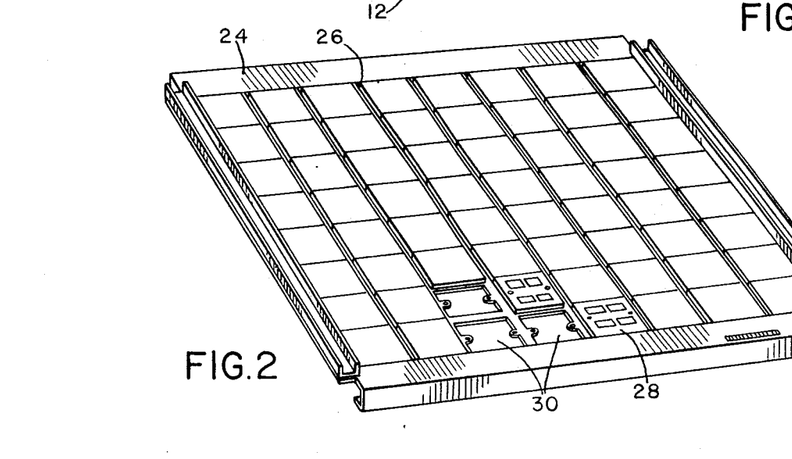
FIG. 2 is a prospective view of a typical test tray.
Figure 3:
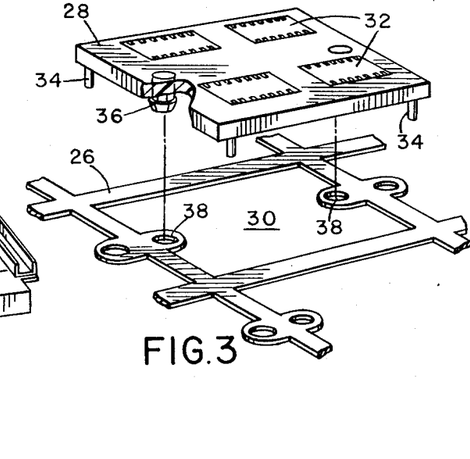
FIG. 3 is an enlarged view of a portion of the test tray showing the attachment of a component holder.

Referring to FIGS. 2 and 3, the sets of devices are transported throughout the test station in a generally planar transport medium, or tray 24, on which the devices are coordinately arranged co-planarly such that the electrical leads of all devices are accessible from at least one common planar side of the tray (which for ease of description only will be arbitrarily hereinafter called a "topside"). The tray comprises a generally planar framework 26 upon which are mounted a plurality of carrier modules 28. The carrier modules align with carrier module holes 30 defined by the framework and preferably arranged in rows and columns as illustrated. The carrier module illustrated in these figures has four electrical device seats 32. Projecting from a base of each carrier module are a plurality of planarization elements 34. The purpose of the elements will be more fully explained later. Also projecting from the base of the carrier module are a pair of carrier module retention latches 36. Preferably, each carrier module has a pair of carrier module retention latches centrally disposed at opposite margins of the carrier module. The latches 36 mate with a corresponding pair of holes 38 defined by the framework. The latches provide a suitable amount of carrier module movement with respect to the framework 26 and normal to the general plane of the frame to enable the carrier modules to effectively "float" on the frame.

Figure 4:
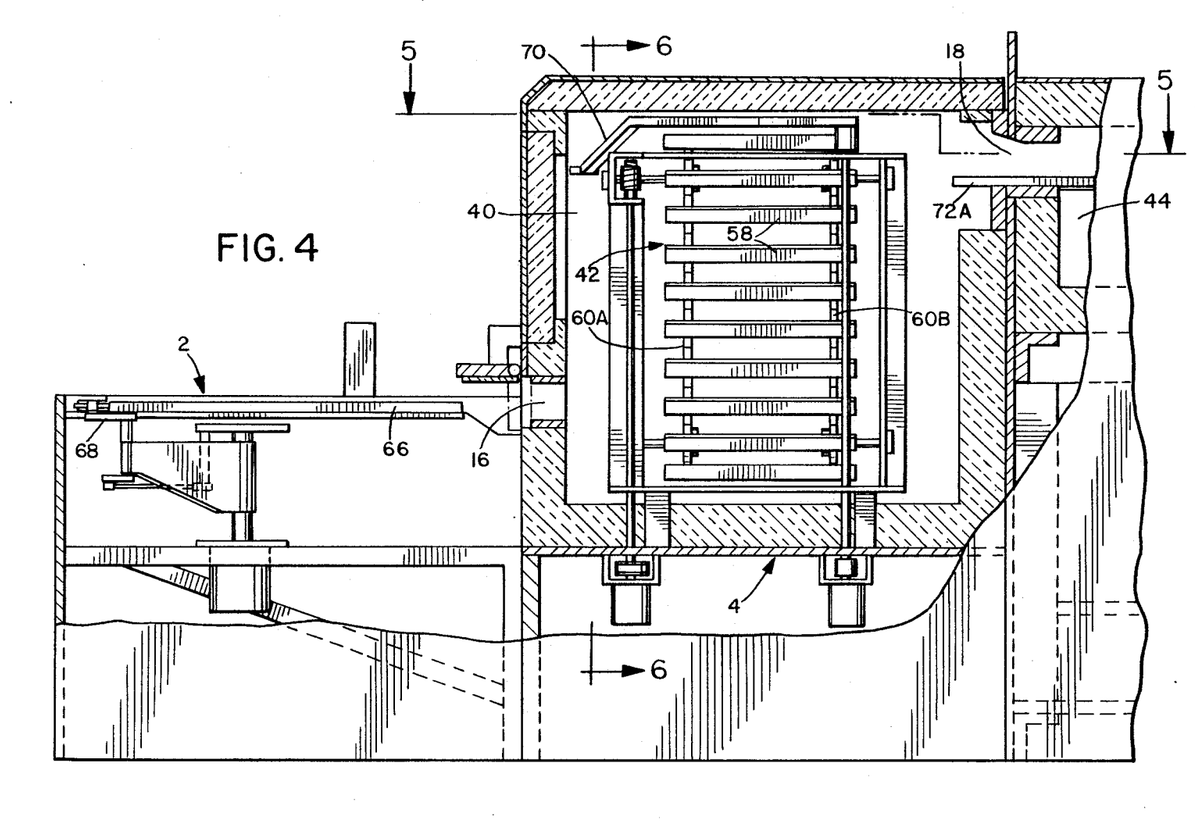
FIG. 4 is a side elevation view, partially cut away, of the load station and soak station of the machine.
Figure 5:
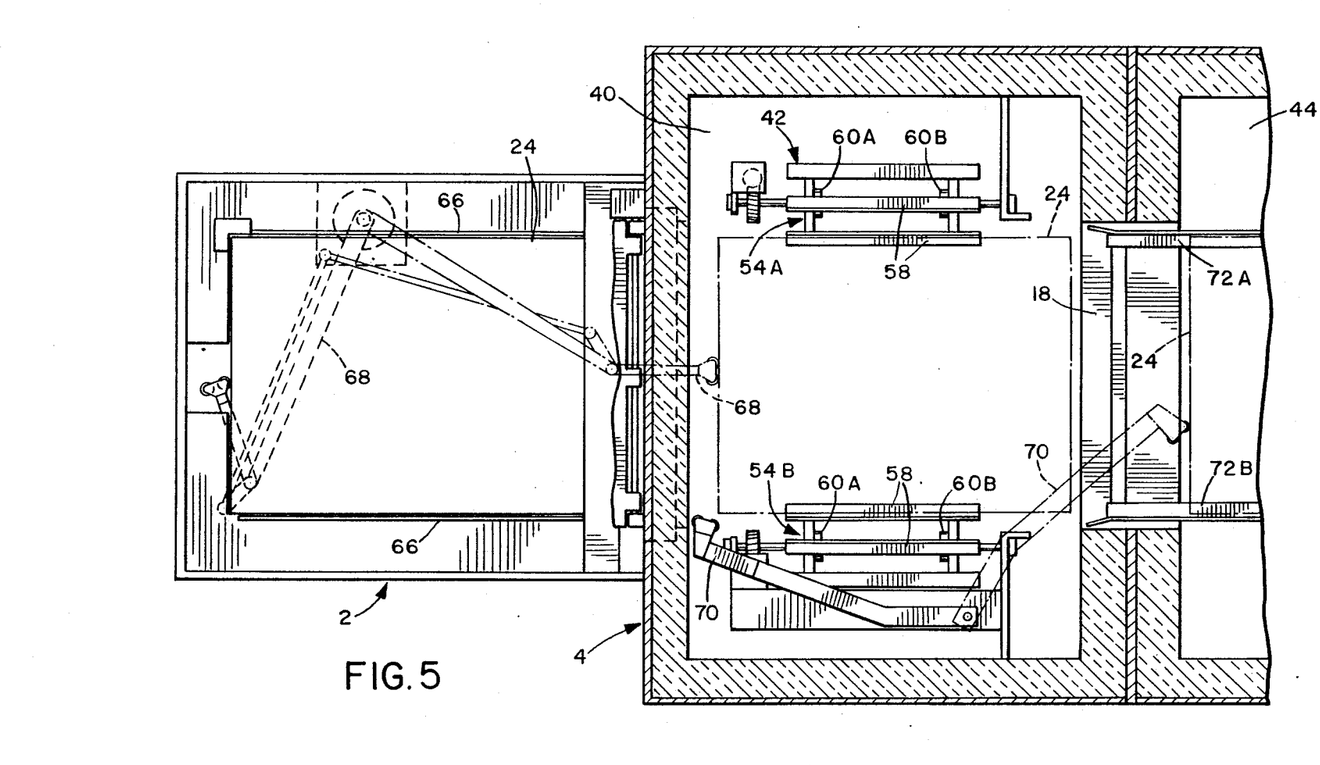
FIG. 5 is a sectional view taken on line 5—5 of FIG. 4.

Referring to FIGS. 4 and 5, to enter the test station, a tray of devices is placed topside up, in the loader 2, which, in response to directions from to the control module 12 moves the tray into a thermally insulated soak chamber 40. When loaded into the soak chamber, the tray is inserted onto an conveyor 42 which subsequently conveys the tray vertically through the soak chamber at a rate which insures that the temperature of the devices is elevated or depressed to a desired testing temperature prior to the insertion of the tray into an insulated test chamber 44.

Figure 7:
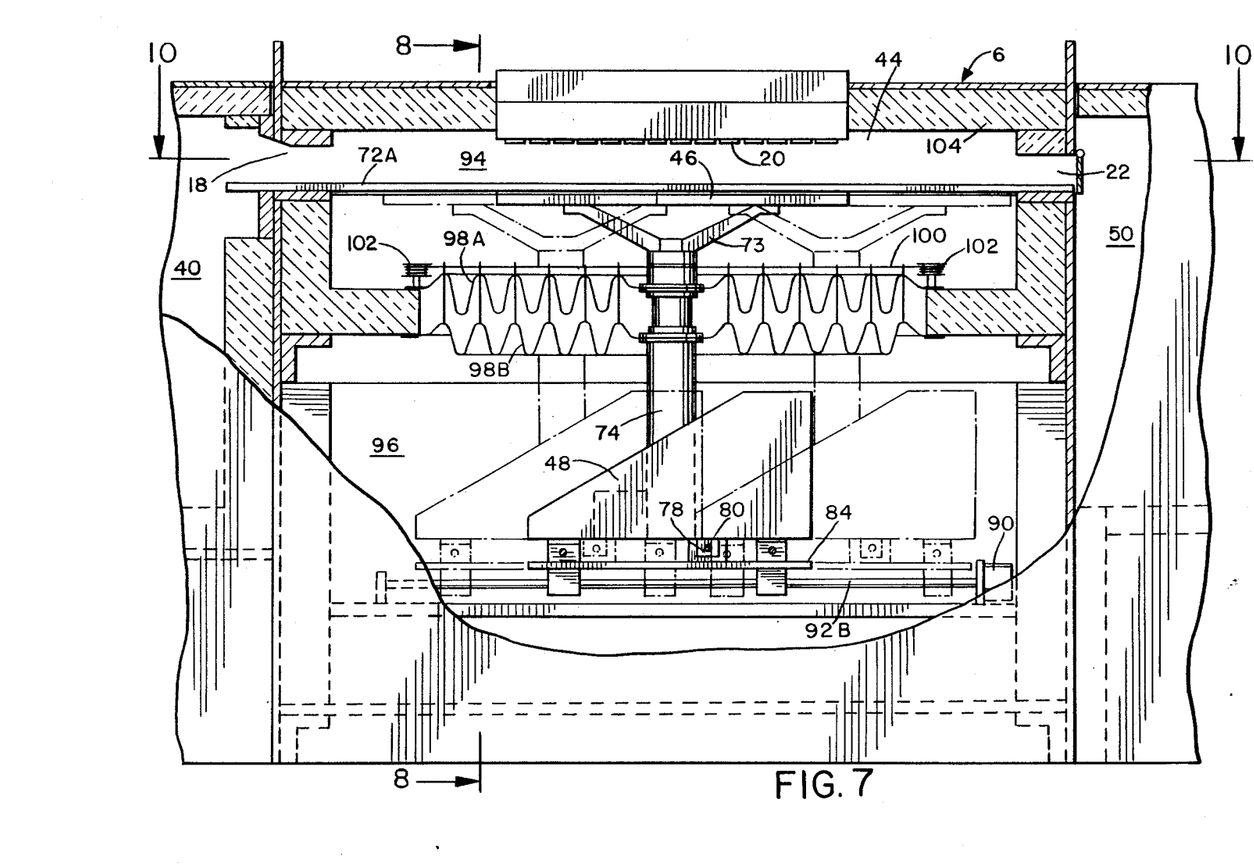
FIG. 7 is a side elevation view partially cut away of the test stage of the machine.
Figure 8:
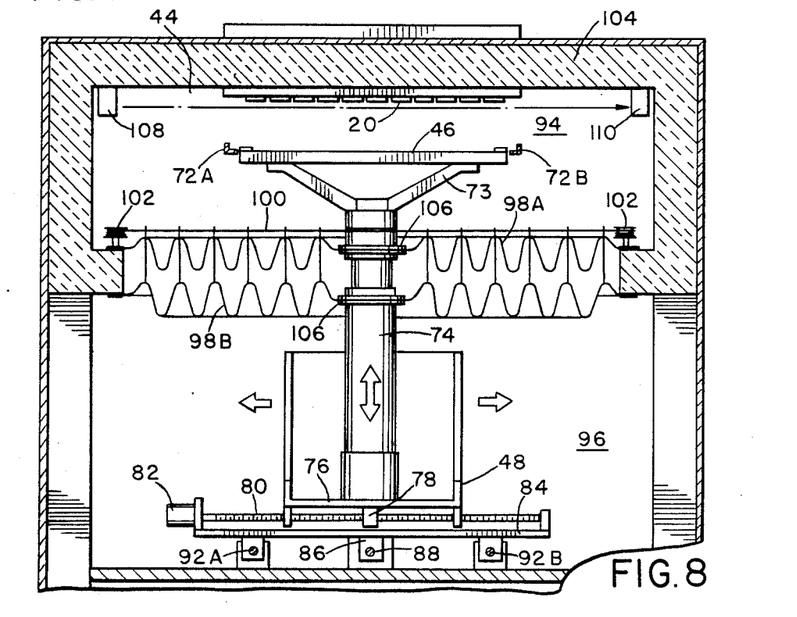
FIG. 8 is a sectional view taken on line 8—8 of FIG. 7.
Figure 10:
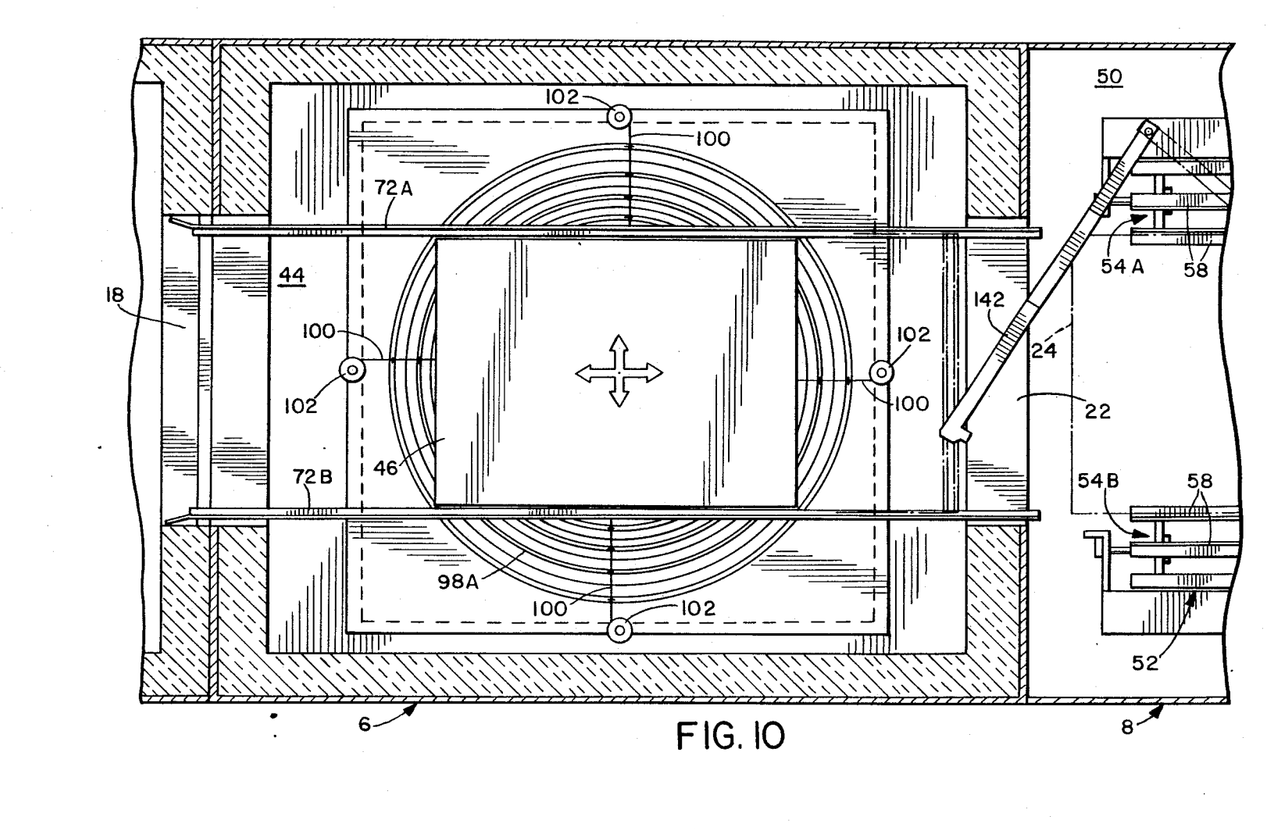
FIG. 10 is a sectional view taken along line 10—10 of FIG. 7.

Referring to FIGS. 7, 8 and 10, in the test chamber 44, the tray is placed upon a platen 46 which is movable by a trolley means 48 along three mutually orthogonal axes, at least one of the axes being orthogonal to the test head 20 which comprises a plurality of test contactors. The trolley means positions the platen beneath the test contactors such that the leads of at least a subset of the devices are registered with contactors, then the platen is raised to bring the leads of the registered devices into electrical contact with the contactors. Tests are then performed on the devices while maintaining them at the desired temperature.

Figure 9:
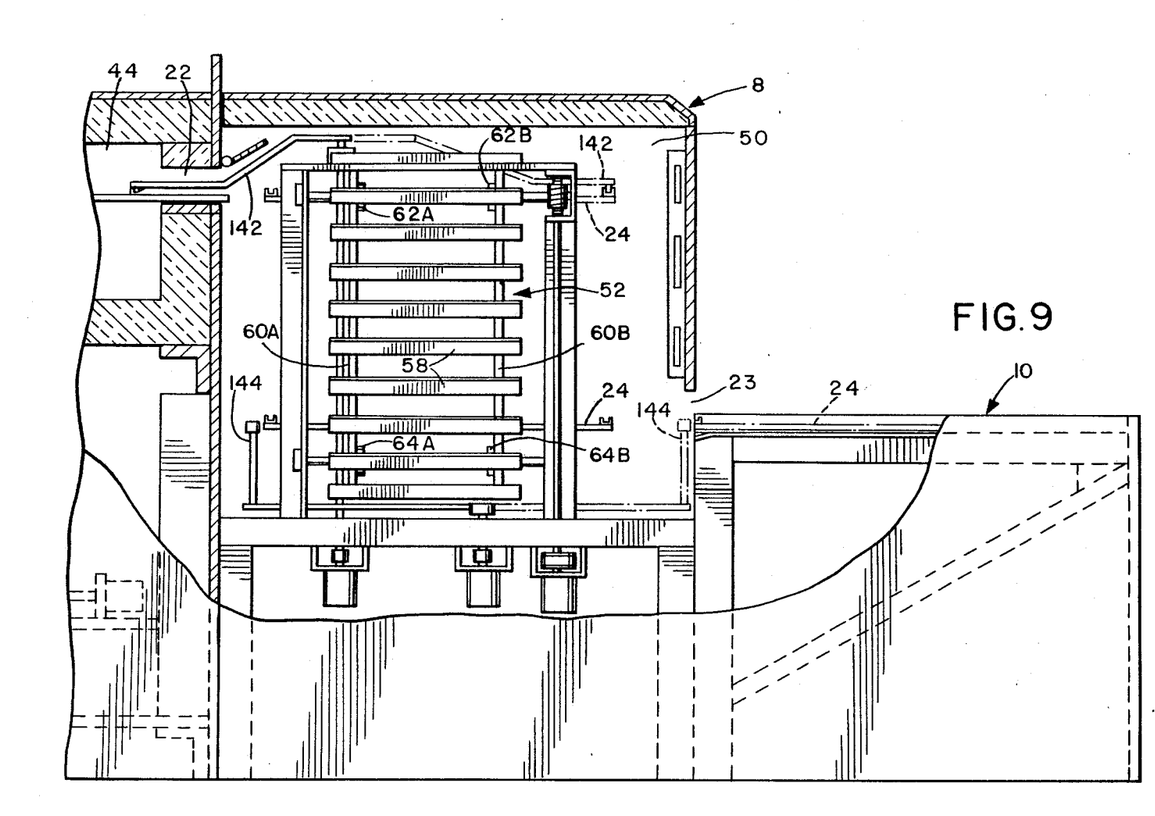
FIG. 9 is a side elevation view partially cut away of the exit stage and unload station of the machine.

Referring to FIG. 9, at the conclusion of the tests, the tray is removed from the insulated test chamber 44 into an unsoak chamber 50. In the unsoak chamber the tray is loaded onto a conveyor 52 which moves the tray through the unsoak chamber at a rate suitable for bringing the temperature of the devices back to or near equilibrium with the environment external to the test station. The tray is then removed from the unsoak chamber by the unloader 10, and from there the trays of devices are transported to further backend processing if appropriate.

Figure 6:
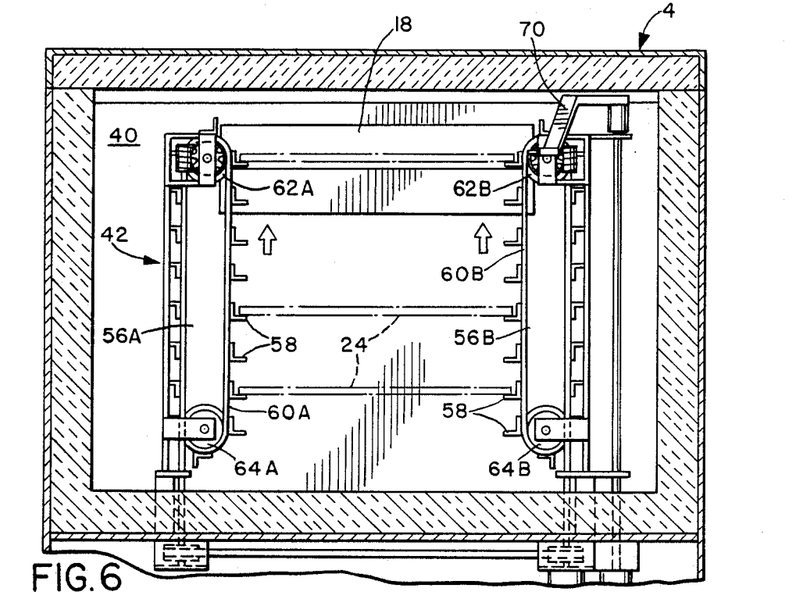
FIG. 6 is a sectional view taken on line 6—6 of FIG. 4.

Referring to FIGS. 4, 5 and 6, the conveyor 42 in the soak chamber 40 has a pair of flexible loops, generally 54A and 54B, of equal length rotating counter to each other around a pair of respective paths having facing, vertical legs, 56A and 56B, of equal length, the vertical legs being suitably spaced apart to allow a tray therebetween. Transversally affixed to each loop are a plurality of rails 58 uniformly spaced apart, the rails of the two loops being horizontally aligned with each other along said vertical legs, 56A and 56B such that pairs of rails traverse the vertical legs in horizontal alignment. Each pair of aligned rails provide horizontal support for opposite margins of a tray for vertically transporting the tray through the soak chamber. As illustrated each flexible loop comprises a pair of spaced matching belt means, 60A and 60B, respectively rotating around drive wheels, 62A and 62B, and idler wheels, 64A and 64B, and the rails are lengths of angle bars.

In operation, a tray being loaded is placed topside up on a pair of tray guides 66 which horizontally support the tray and which align the tray with the conveyor means 42 while guiding the tray into the soak chamber 40. At an appropriate time, an articulated insertion arm 68 pushes the tray along the tray guides 66 through the open slot gate 16 onto one of the tray seats, and the tray is vertically transported through the soak chamber at a rate to ensure that the devices are at the proper temperature prior to the tray being moved into the test chamber.

Referring to FIGS. 9 and 10, the unsoak conveyor 52 is generally identical to the soak conveyor except that it conveys the trays away from the test chamber. As illustrated the trays are conveyed vertically downward by counter rotating loops, 54A and 54B, and pairs of rails 58 as in the soak conveyor except that the loops are rotating oppositely to the loops in the soak conveyor.

Referring again to FIGS. 4 and 5, when a tray has traversed through the soak chamber to the furthest extent of the conveyor 42 and the test chamber 44 does not have a tray therein, an articulated arm 70 hooks the tray and slides it horizontally along its supporting conveyor rails 58 toward the passageway 18 leading into the test chamber. At some point the tray encounters fixed guide rails, 72A and 72B, at opposite sides of the passageway which guide the tray into the test chamber. FIG. 5 illustrates the initial position of the articulated arm 70 in solid and the final position of the arm in phantom lines.

Referring to FIG. 7, 8 and 10, the platen 46 is mounted upon a support yoke 72 which is fixed atop a telescopic post 74 which functions under motor control to raise or lower the platen. The telescopic post is mounted atop a platform 76 which is moveable horizontally along two mutually orthogonal axes. Affixed to the underside of the telescopic post platform is a threaded nut 78 which engages a cross feed screw 80 driven by motor 82 to move the platform 76 horizontally along a first axis as shown by the arrows pointing to the sides of the test stage illustrated in FIG. 6. The motor 82 and cross feed screw are also mounted on a platform 84. Affixed below the cross feed screw platform 84 is a threaded nut 86 which engages a linear feed screw 88 driven by motor 90. Guide rails, 92A and 92B, provide stability for the cross feed screw platform as the linear feed screw moves said platform back and forth along an axis orthogonal to the cross feed screw axis.

Referring to FIGS. 7 and 8, the test stage is illustrated as being divided into two separate chambers. An upper chamber 94 and a lower chamber 96 are thermally divided by a diaphram seal comprising a pair of spaced, concentrically convoluted bellows, an upper 98A and a lower 98B, which provide a flexible thermal barrier between the upper chamber 94 and the lower chamber 96. Both bellows are supported by a plurality by suspension cables 100, each of which is kept taut by opposing spring-loaded pulleys 102 mounted around the periphery of the upper chamber 94. Preferably, the space between the bellows is purged with heated nytrogen to provide a very efficient thermal barrier. In addition, the upper chamber is insulated by thermal insulation 104, whereas the lower chamber need not be so insulated. The bellows are sealed around the telescopic post 74 by retaining rings 106. Projecting downward from the roof of the upper chamber 94 are an infrared beam emitter and detector pair, 108 and 110 respectively. The infrared beam shown in dash lines is in a plane parallel with the contactors of the test head 20 but spaced vertically below. In operation, as the platen raises a tray toward the contactors of the test head, the infrared beam detects any unusual projections from the tray. If unusual projections are present, the testing is stopped and remedial action is taken. To scan the entire tray, the platen is moved across the beam until the entire topside of the tray is scanned by the beam. Preferably, the single line infrared beam is positioned about ½ inch below the test head contactors.

Figure 11:
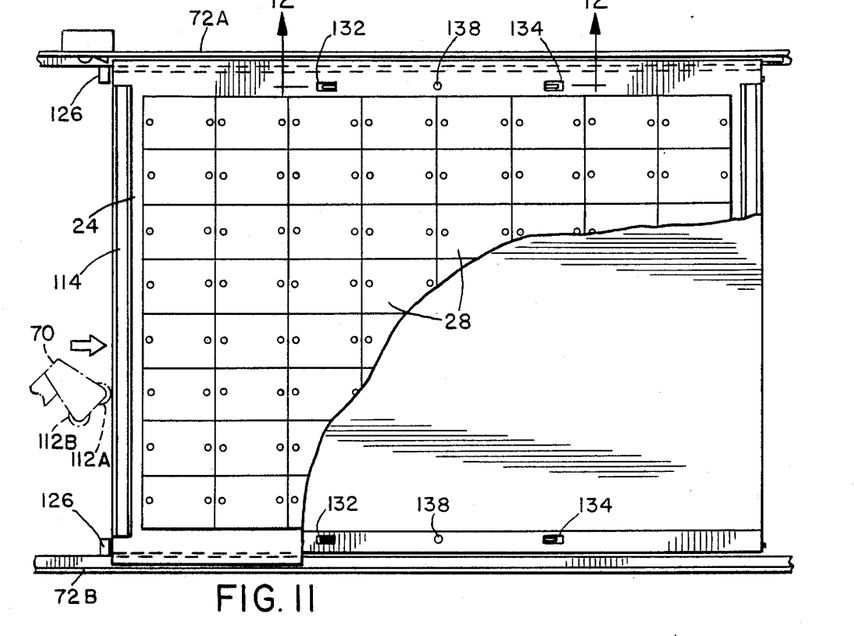
FIG. 11 is an enlarged view of a portion of FIG. 10, showing a test tray in place of the platen.
Figure 12:
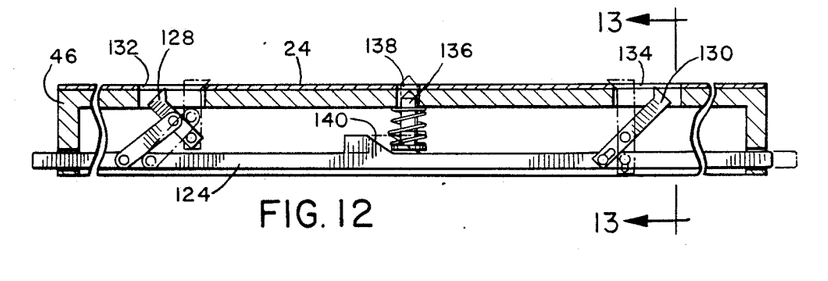
FIG. 12 is an enlarged sectional view taken on line 12—12 of FIG. 11.
Figure 13:
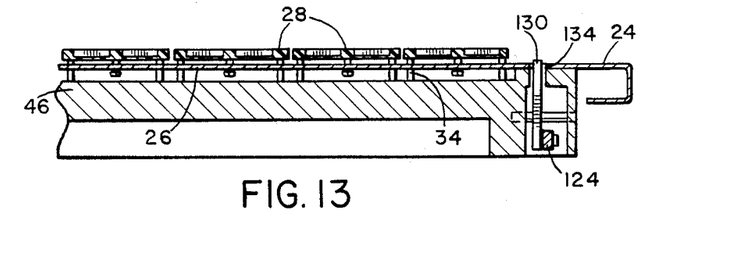
FIG. 13 is a sectional view taken along line 13—13 of FIG. 11.
Figure 14:
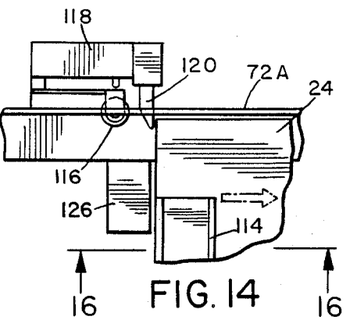
FIG. 14 is an enlargement of a portion of FIG. 11, showing the test tray indexing stop.
Figure 15:
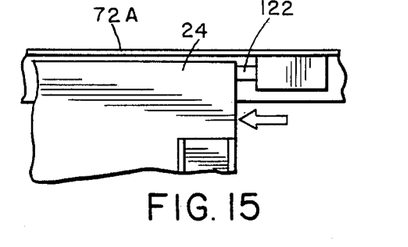
FIG. 15 is an enlargement of a portion of FIG. 11, showing the test tray setting stop.
Figure 16:
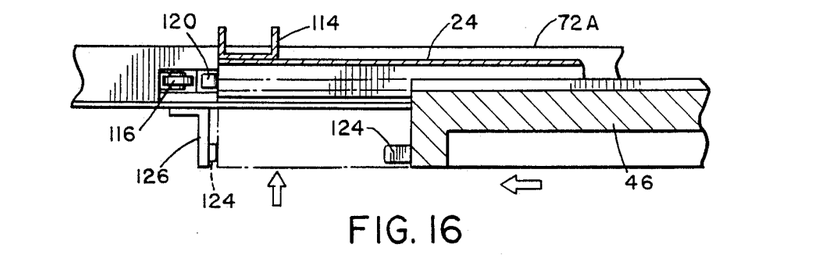
FIG. 16 is a sectional view taken on line 16—16 of FIG. 14, showing the engagement of the platin with the test tray.

Referring to FIGS. 11, through 16, the means by which a tray 24 is latched onto a platen 46 is illustrated. The articulated arm 70 from the soak chamber is shown partially in its fully extended position in FIG. 11. Rollers 112A and 112B disposed at the end of the arm 70 bear against a reinforcing channel 114 at an edge of a tray. In operation, the arm 70 slides the tray onto to the test chamber guiderails 72A and 72B. As the tray slides along guiderail 72A its forward edge encounters a roller 116 which protrudes into the guiderail. The tray pushes the roller out of its way causing the roller to actuate a microswitch 118 which indicates to the control module that a tray is being loaded. When the tray is fully loaded, the roller returns to its initial position deactuating the microswitch which indicates to the control module that the tray is fully loaded. The tray is latched into its fully loaded position by a locating latch 120 which like the roller 116 projects into the guiderail 72A and is pushed back by the tray. In operation as the tray is loaded, it is pushed onto the guiderail 72A and 72B until it encounters a spring bumper 122. The spring bumper gives enough for the tray to go fully past the locating latch 120 which permits said latch to return to its initial position. The locating latch in its initial position holds the tray between it and the spring bumper 122. Once the tray is fully loaded and latched by the locating latch 120, the platen is then moved under the tray to pick it up. On opposite sides of the platen, the sides parallel to the guiderail 72A and 72B, there are disposed push bars 124. FIGS. 12, 13 and 16 illustrate the operation of the pushbars. As the platen moves into position under the fully loaded tray, the push bars encounter push bar bumpers 126. The bumpers cause the push bars to stop while the platen continues to move forward into position. Thus, the pushbars are pushed back into the platen causing a pair of latching arms, 128 and 130, to opposally close. As they close, they pass through slots, 132 and 134 respectively, defined by the tray. At their fully closed position they hook the tray and latch it onto the platen. The latching arms are pivotted to the pushbar to operate in the fashion just described. Also, as the latching arms are hooking the tray, a locating pin 136 can be registered in a hole 138 defined by the tray to further register the tray onto the platen. The locating pin can be raised by a cam 140 on the pushbar, the pin being a cam rider.

FIG. 13 illustrates how the carrier modules 28 are planarized by resting upon the platen only by their planarization elements independent of the tray framework 26.

When the testing is completed, the platen is moved to the opposite end of the test chamber toward the unsoak chamber. The platen is also lowered to the point where the tray is resting upon or in close proximity to the guiderails of 72A and 72B. As the platen approaches the extremity of the test chamber at the second gate 22, the pushbars 122, which are at that time projecting from the end of the platen approaching the second gate 22, encounter stops substantially identical to the stops encountered at the other extremity of the test chamber when the platen was picking up the tray. The stops cause the push bars to move in the opposite direction thereby causing the latching arms, 128 and 130, to open and release the tray from the platen. A third articulated arm 142 catches the reinforcing channel at the opposite end of the tray and pulls the tray into the unsoak chamber onto a pair of unsoaked conveyor rails 58. The tray passes through the unsoak chamber causing the temperature of the tray and its devices to acclimatize to the temperature ambient to the test center, and a fourth articulated arm 144 removes the tray from the unsoak chamber.

Various embodiments of the invention have been described in detail. Further, several changes and modifications can be made to these preferred embodiments without departing from the nature and the spirit of the invention. Therefore, it is to be understood that the invention is not limited to said details but is defined in the appended claims.

We claim:

1. A test station for electrical devices being transported in sets, each set being in or on a transport medium which holds the devices in a planar array with the leads of the devices all accessible from at least one common face of the array, comprising:
   (a) a platen means having an upward facing flat surface upon which a transport medium containing an array of electrical devices is placed for testing with the leads of the devices accessible from above,
   (b) a test head means having an planar array of electrical device lead contactors registerable with the leads of subsets of the devices and spaced above and in parallel with the platen means,
   (c) means for moving the platen means to bring the contactors in registration and contact with the leads of the devices comprising an extensible post atop of which the platen means is affixed, and a base upon which the post is affixed and supported, the base being movable along two mutually orthogonal axes which are both normal to an axis of the post,
   (d) a thermally insulated chamber in which are disposed the platen means and the contactors of the test head means, the insulation being for the purpose of maintaining the temperature of the devices during test,
   (e) means defined by walls of the chamber for ingress from the soak means and egress to the unsoak means of the electrical device arrays,
   (f) means for closure of the ingress and egress,
   (g) a lower wall of the chamber comprising a thermally insulated diaphragm means defining a central opening through which the extensible post extends, the diaphragm means being contractible in any given direction normal to the axis of the extensible post and simultaneously expandable in the opposite direction to permit full movement the trolley means, and
   (h) means for thermally sealing the interface between the post and the diaphragm means.

2. The test station of claim 1 wherein the diaphragm means comprises two spaced diaphragms each concentrically convoluted and both supported by a plurality of suspension cables, the ends of each such cable being spooled around a pair of pulleys disposed at opposite margins of the diaphragm means and biased to rotate in opposite directions to keep their respective cable taut at all times, the space between the diaphragms being hermetically sealed and filled with a gas.

3. A test station for electrical devices being transported in sets, each set being in or on a transport medium which holds the devices in a planar array with the leads of the devices all accessible from at least one common face of the array, comprising:
 (a) a platen means having an upward facing flat surface upon which a transport medium containing an array of electrical devices is placed for testing with the leads of the devices accessible from above,
 (b) a test head means having an planar array of electrical device lead contactors registerable with the leads of subsets of the devices and spaced above and in parallel with the platen means,
 (c) means for moving the platen means to bring the contactors in registration and contact with the leads of the devices comprising an extensible post atop of which the platen means is affixed, and a base upon which the post is affixed and supported, the base being movable along two mutually orthogonal axes which are both normal to an axis of the post,
 (d) means for thermally soaking each device array prior to its being placed upon the platen means for testing,
 (e) means for thermally unsoaking each device array following testing,
 (f) a thermally insulated chamber in which are disposed the platen means and the contactors of the test head means, the insulation being for the purpose of maintaining the temperature of the devices during test,
 (g) means defined by walls of the chamber for ingress from the soak means and egress to the unsoak means of the electrical device arrays,
 (h) means for closure of the means for egress,
 (i) a lower wall of the chamber comprising a thermally insulated diaphragm means defining a central opening through which the extensible post extends, the diaphragm means being contractible in any given direction normal to the axis of the extensible post and simultaneously expandable in the opposite direction to permit full movement the trolley means, and
 (j) means for thermally sealing the interface between the post and the diaphragm means.

4. The test station of claim 3 wherein the diaphragm means comprises two spaced diaphragms each concentrically convoluted and both supported by a plurality of suspension cables, the ends of each such cable being spooled around a pair of pulleys disposed at opposite margins of the diaphragm means and biased to rotate in opposite directions to keep their respective cable taut at all times, the space between the diaphragms being hermetically sealed and filled with a gas.

5. A test station for electrical devices being transported in sets, each set being in or on a transport medium which holds the devices in a planar array with the leads of the devices all accessible from at least one common face of the array, comprising:
 (a) a platen means having an upward facing flat surface upon which a transport medium containing an array of electrical devices is placed for testing with the leads of the devices accessible from above,
 (b) a test head means having an planar array of electrical device lead contactors corresponding to the leads of the devices and spaced above and in parallel with the platen means,
 (c) means for moving the platen means to bring the contactors in contact with the leads of the devices comprising an extensible post atop of which the platen means is affixed,
 (d) a thermally insulated chamber in which are disposed the platen means and the contactors of the test head means, the insulation being for the purpose of maintaining the temperature of the devices during test,
 (e) means defined by walls of the chamber for ingress from the soak means and egress to the unsoak means of the electrical device arrays,
 (f) means for closure of the means for egress,
 (g) an opening defined by a lower wall of the chamber through which the extensible post extends, and
 (e) means for thermally sealing the interface between the post and the lower chamber wall.

6. The test station according to claim 5 further comprising:
 (a) means for thermally soaking each device array prior to its being placed upon the platen means for testing, and
 (b) means for thermally unsoaking each device array following testing.

* * * * *